(12) United States Patent
Song

(10) Patent No.: US 8,531,895 B2
(45) Date of Patent: Sep. 10, 2013

(54) CURRENT CONTROL CIRCUIT

(75) Inventor: Woo Seok Song, Chungcheongbuk-do (KR)

(73) Assignee: Hynix Semiconductor Inc., Icheon (KR)

( * ) Notice: Subject to any disclaimer, the term of this patent is extended or adjusted under 35 U.S.C. 154(b) by 72 days.

(21) Appl. No.: 13/347,102

(22) Filed: Jan. 10, 2012

(65) Prior Publication Data

US 2012/0287735 A1    Nov. 15, 2012

(30) Foreign Application Priority Data

May 11, 2011    (KR) .................. 10-2011-0044207

(51) Int. Cl.
*G11C 7/00*    (2006.01)

(52) U.S. Cl.
USPC ............. 365/191; 365/189.06; 365/189.11; 327/108

(58) Field of Classification Search
USPC ........................................ 323/312
See application file for complete search history.

(56) References Cited

U.S. PATENT DOCUMENTS

| | | | | |
|---|---|---|---|---|
| 5,896,319 A * | 4/1999 | Takehana | ............... | 365/185.29 |
| 6,140,864 A | 10/2000 | Hirata et al. | | |
| 6,313,670 B1 * | 11/2001 | Song et al. | ............... | 327/108 |
| 7,499,316 B2 * | 3/2009 | Choi et al. | ............... | 365/163 |
| 2007/0103209 A1 | 5/2007 | Lee | | |

FOREIGN PATENT DOCUMENTS

| | | |
|---|---|---|
| KR | 10-1998-0028187 A | 7/1998 |
| KR | 100638998 B1 | 10/2006 |
| KR | 100668498 B1 | 1/2007 |
| KR | 10-2008-0102023 A | 11/2008 |

* cited by examiner

*Primary Examiner* — Tan T. Nguyen

(57) ABSTRACT

A current control device is disclosed, which reduces a standby current of a semiconductor memory device and a turn-on current of a transistor. The current control device includes an input controller configured to combine a trigger signal and a set signal controlling a circuit operation status, and a drive unit configured to drive an output signal of the input controller, wherein the drive unit includes a current controller for selectively providing a ground voltage in response to an activation status of a pull-down driving signal.

19 Claims, 5 Drawing Sheets

US 8,531,895 B2

CURRENT CONTROL CIRCUIT

CROSS-REFERENCE TO RELATED APPLICATION

The priority of Korean patent application No. 10-2011-0044207 filed on May 11, 2011, the disclosure of which is hereby incorporated in its entirety by reference, is claimed.

BACKGROUND OF THE INVENTION

The present invention relates to a current control device, and more specifically to a current control device capable of reducing a standby current of a semiconductor memory device and a turn-on current of a transistor.

With the development of computing systems and information communication technology, semiconductor memory devices for storing information therein have been rapidly developed to be manufactured with lower costs and to have smaller sizes and larger capacitance. In addition, as demand for the reduction of energy consumption also increases, semiconductor devices have been developed to restrict unnecessary current consumption.

Generally, a cell array of a dynamic random access memory (DRAM) device includes a plurality of cells coupled to word lines and bit lines that are interconnected in the form of a net. Each cell includes one NMOS transistor and one capacitor.

Operations of a general DRAM device will hereinafter be described in detail.

First, a row strobe signal (/RAS) for operating the DRAM device is activated to a low level, so that row address signals are input to a row address buffer. A row decoding operation for selecting one of word lines contained in the cell array is carried out by decoding the row address signals.

In this case, the data of cells coupled to the selected word line is applied to a pair of bit lines BL and /BL composed of a bit line and its complementary bit line. A sense-amplifier (also called a sense-amp) enable signal indicating an operation start time of a sense amplifier is enabled to drive a sense-amp driving circuit of a cell block selected by the row address signals.

After that, sense-amp bias potentials are transitioned to a core potential Vcore and a ground potential Vss by the sense-amp driving circuit, so that the sense amplifier is driven. If the sense amplifier starts its operation, voltages of the bit lines BL and /BL that have maintained a slight potential difference therebetween are transitioned to have a high potential difference therebetween.

Thereafter, a column decoder turns on a column transfer transistor that transfers data from each bit line to data bus lines in response to column address signals, such that data stored in the pair of bit lines BL and /BL is output to the outside of the semiconductor memory device through the data bus lines DB and /DB.

FIG. 1 illustrates a signal processing circuit diagram of a typical semiconductor memory device.

Referring to FIG. 1, the signal processing circuit includes a NAND gate ND1 and a plurality of inverters IV1~IV4.

The NAND gate ND1 performs a logic NAND operation on a trigger signal TRIGGER and a set signal SET and outputs the NAND operation result. The inverters IV1~IV4 drive an output signal of the NAND gate ND1 and output an output signal OUT.

The typical semiconductor memory device may further include a variety of circuit elements, for example, a NOR gate, a transistor, etc.

The typical semiconductor memory device may be implemented as a user-desired semiconductor memory device by a combination of an inverter, a NAND gate, a NOR gate, and a transistor.

In the typical semiconductor memory device, an inverter, a NAND gate, a NOR gate, a tri-state gate, etc. are implemented on the basis of transistors. A multi-input circuit is constructed using a combination of an AND gate and an OR gate.

For example, as can be seen from FIG. 1, an AND circuit composed of a two-input NAND gate, e.g., ND1, and a plurality of inverters, e.g. IV1~IV4, outputs a high-level output signal OUT when two inputs are high in level.

In this case, the two input signals SET and TRIGGER may be input at the same time. However, if the set signal SET is first input to set the circuit to a set status, an output time of the output signal OUT may be determined by the trigger signal TRIGGER that is input after the set signal SET. In other words, each circuit logic has been designed to include the set signal SET and the trigger signal TRIGGER. A general circuit logic may be classified into one case in which a circuit enters an idle status upon receiving a set signal SET for setting the circuit and the other case in which the set signal SET and an idle entry signal are separated from each other.

If the semiconductor memory device enters the idle status as a user-desired operation is completed or if the semiconductor memory device such as a DRAM device enters a current reduction status such as a power-down mode, some transistors contained in an inverter circuit may maintain a turn-on status, or an off-leakage current may be generated in some other transistors.

The above-mentioned semiconductor memory device has been designed to unnecessarily consume the off-leakage current and/or the transistor turn-on current during the idle status and/or the power-down mode.

Numerous inverters have been used in most circuits. Accordingly, the off-leakage current and the transistor turn-on current may be unnecessarily consumed in, e.g., a circuit using an inverter having a large width, a delay circuit, and a delay chain.

BRIEF SUMMARY OF THE INVENTION

Various embodiments of the present invention are directed to providing a current control device, which may substantially obviate one or more problems due to limitations or disadvantages of the related art.

Embodiments of the present invention relate to a current control device for controlling a path to a ground voltage VSS of a semiconductor memory device, such that it can reduce a standby current generated in a circuit and a turn-on current of a transistor according to whether the semiconductor memory device enters an idle status or a power down mode.

In accordance with one embodiment of the present invention, a current control circuit includes an input controller configured to combine a trigger signal and a set signal, wherein the set signal controls an internal operation of a semiconductor device, and a drive unit configured to drive an output signal of the input controller in response to a pull-down signal, wherein the drive unit includes an inverter unit configured to drive the output signal of the input controller, and a current controller configured to selectively provide a ground voltage to the inverter unit in response to the pull-down driving signal.

In accordance with another embodiment of the present invention, a current control circuit includes an input controller configured to combine a trigger signal, a bank active signal, and a set signal, wherein the set signal controls an internal operation of a semiconductor device; and a drive unit configured to drive an output signal of the input controller in response to a pull-down driving signal, wherein the drive unit includes, an inverter unit configured to drive the output signal of the input controller; and a current controller configured to selectively provide a ground voltage to the inverter unit in response to the pull-down driving signal.

The inverter unit comprises a plurality of inverter elements serially connected in the form of an inverter chain, and wherein the semiconductor device is a memory device.

The current controller may comprises a plurality of pull-down driving elements coupled between the inverter unit and a ground voltage terminal, the pull-down driving elements being selectively activated in response to the pull-down driving signal.

The current control circuit may further comprise a drive signal generator configured to generate the pull-down driving signal.

The drive signal generator may include a falling delay unit configured to delay a falling start time of the set signal by a predetermined time; and an output unit configured to combine an output signal of the falling delay unit and a power-down signal so as to generate the pull-down driving signal.

The drive signal generator may deactivate the pull-down driving signal irrespective of activation of the output signal of the falling delay unit, when the power-down signal is activated.

The current control circuit may further include a storage unit configured to latch an output signal of the drive unit for a predetermined time.

The current controller may operates in response to the pull-down driving signal and prevent the ground voltage from being supplied to the inverter unit in a power-down mode.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
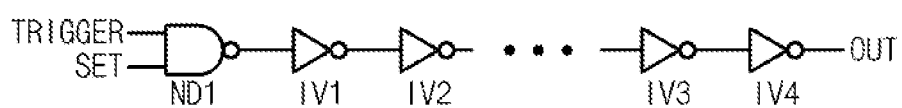
FIG. 1 illustrates a signal processing circuit diagram of a typical semiconductor memory device.
Figure 2:
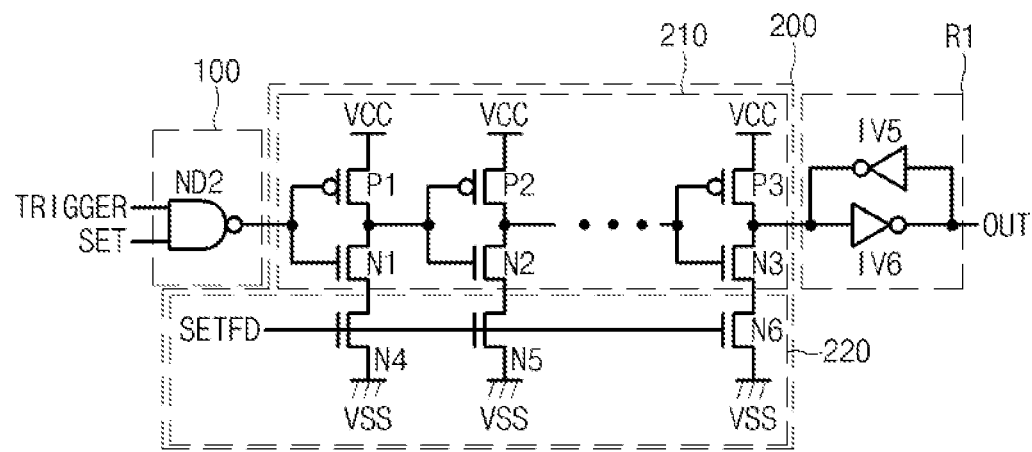
FIG. 2 illustrates a circuit diagram of a current control device according to an embodiment of the present invention.

FIG. 2 illustrates a circuit diagram of a current control device according to an embodiment of the present invention.

Referring to FIG. 2, the current control device includes an input controller 100, a drive unit 200, and a storage unit R1.

The input controller 100 includes a NAND gate ND2. The NAND gate ND2 performs a NAND operation on a trigger signal TRIGGER and a set signal SET and outputs the NAND operation result.

The set signal SET may be used to control driving of a circuit such as a semiconductor device. If the set signal SET is activated, a circuit receiving the set signal SET starts its internal operation. The trigger signal TRIGGER may correspond to a preparation signal for activating a sense amplifier in the semiconductor device.

The drive unit 200 includes an inverter unit 210 and a current controller 220.

The inverter unit 210 includes pairs of PMOS transistors P1~P3 and NMOS transistors N1~N3. In other words, the inverter unit 210 includes a plurality of inverters serially connected in the form of an inverter chain. In another embodiment, the inverter unit 210 may be composed of a plurality of delay elements connected in series to each other.

The current controller 220 includes a plurality of pull-down driving elements disposed between the inverter unit 210 and a ground voltage terminal VSS. The pull-down driving elements are controlled by a pull-down driving signal SETFD. The pull-down driving elements are composed of NMOS transistors N4~N6.

The NMOS transistors N4, N5 and N6 of the current controller 220 are coupled to the NMOS transistors N1, N2, and N3 of the inverter unit 210, respectively. The NMOS transistors N4~N6 may receive the pull-down driving signal SETFD through their common gate terminal.

Accordingly, the PMOS transistor P1, the NMOS transistor N1, and the NMOS transistor N4 are serially coupled between a power-supply voltage terminal VCC and the ground voltage terminal VSS. The PMOS transistor P1 and the NMOS transistor N1 receive an output signal of the NAND gate ND2 through their common gate terminal. The NMOS transistor N4 receives the pull-down driving signal SETFD through a gate terminal.

The PMOS transistor P2, the NMOS transistor N2, and the NMOS transistor N5 are serially coupled between the power-supply voltage terminal VCC and the ground voltage terminal VSS. A common gate terminal of the PMOS transistor P2 and the NMOS transistor N2 is coupled to an inverter element of the previous stage, e.g., an output terminal of the inverter composed of the PMOS transistor P1 and the NMOS transistor N1. The NMOS transistor N5 receives the pull-down driving signal SETFD through a gate terminal.

The PMOS transistor P3, the NMOS transistor N3, and the NMOS transistor N6 are serially coupled between the power-supply voltage terminal VCC and the ground voltage terminal VSS. A common gate terminal of the PMOS transistor P3 and the NMOS transistor N3 is coupled to an inverter element of a previous stage. The NMOS transistor N6 receives the pull-down driving signal SETFD through a gate terminal.

The storage unit R1 includes latch-type inverters IV5 and IV6 in which an input terminal of the inverter IV5 is coupled to an output terminal of the inverter IV6 and an output terminal of the inverter IV5 is coupled to an input terminal of the inverter IV6. The storage unit R1 latches an output signal of the drive unit 200 and outputs an output signal OUT.

Figure 3:
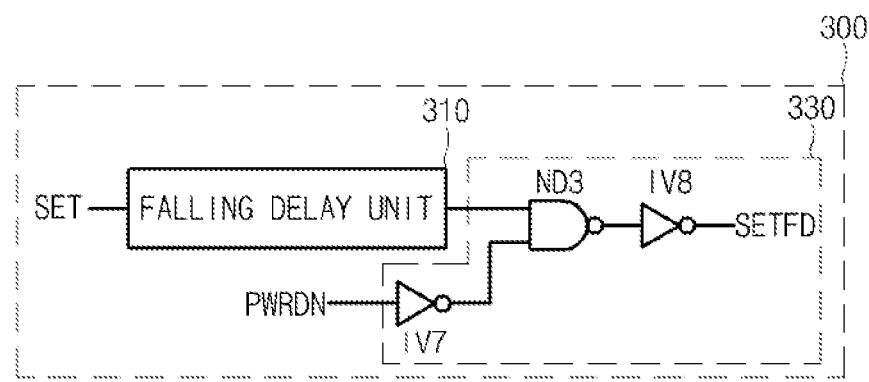
FIG. 3 illustrates a detailed circuit diagram of a drive signal generator according to an embodiment of the present invention.

FIG. 3 illustrates a detailed circuit diagram of a drive signal generator 300 for generating the pull-down driving signal SETFD used in the current control device shown in FIG. 2 according to an embodiment of the present invention.

Referring to FIG. 3, the drive signal generator 300 includes a falling delay unit 310 and an output unit 330.

The falling delay unit 310 delays a falling time of the set signal SET and outputs a delayed set signal. That is, if the set signal SET is enabled to a high level, the falling delay unit 310 extends a period of the high level status by a predetermined time, such that a transition start time for the falling status is delayed by the predetermined time.

The output unit 330 includes inverters IV7 and IV8 and a NAND gate ND3. The NAND gate ND3 performs a NAND operation on an output signal of the falling delay unit 310 and an inverted power down signal output from the inverter IV7 that inverts a power down signal PWRDN. The inverter IV8 inverts an output signal of the NAND gate ND3 to output the pull-down driving signal SETFD.

Operations of the current control device shown in FIG. 2 will hereinafter be described in detail with reference to FIGS. 2 and 3.

For convenience of description and better understanding of the present invention, although an embodiment of the present invention describes a case of using the power-down signal PWRDN that is activated during a power-down mode, the scope or spirit of the present embodiment is not limited thereto, and can also be applied to another case in which a standby signal is activated during a standby mode.

In a normal operation mode, not the power-down mode, the power-down signal PWRDN is deactivated to a low level. Accordingly, the inverted power down signal output from the inverter IV7 has a high level.

In addition, if a bank is selected in an active operation, the set signal SET transitions from a low level to a high level. As a result, the output signal of the NAND gate ND3 goes to a low level, and the pull-down driving signal SETFD corresponding to the output signal of the inverter IV8 goes to a high level.

In this case, if the set signal SET goes to a high level and the trigger signal TRIGGER goes to a low level, the output signal of the NAND gate ND2 goes to a high level so that the inverter unit 210 operates.

When the pull-down driving signal SETFD goes to a high level, all the NMOS transistors N4~N6 of the current controller 220 are turned on. As a result, a ground voltage VSS is supplied to source terminals of the NMOS transistors N1~N3 of the inverter unit 210.

After that, when the trigger signal TRIGGER is activated to a high level, the output signal of the NAND gate ND2 goes to a low level so that the current control device normally operates.

Subsequently, if the trigger signal TRIGGER is deactivated to a low level and the set signal SET transitions from a high level to a low level, the falling start time of the set signal SET is delayed by the predetermined time by the falling delay unit 310. In other words, although the set signal SET is transitioned to a low level, the output signal of the falling delay unit 310 maintains a high level for at least the predetermined time.

Therefore, the pull-down driving signal SETFD maintains a high level for at least the predetermined time, such that the current controller 220 is continuously turned on. If the current controller 220 maintains the turn-on status, the ground voltage VSS is continuously provided to the inverter unit 210 such that an operation time of the storage unit R1 can be guaranteed.

After lapse of a delay time of the falling delay unit 310, the pull-down driving signal SETFD transitions from a high level to a low level, such that each NMOS transistor in the current controller 220 is turned off to prevent the ground voltage VSS from being applied to the inverter unit 210. As a result, the inverter unit 210 is deactivated.

The storage unit R1 latches a previous output level to prevent the output signal of the inverter unit 210 from entering an abnormal status during the ground voltage VSS is not applied to the inverter unit 210.

The embodiment of the present invention performs user-desired operations upon receiving the set signal SET, obtains the operation time of the storage unit R1 using the falling-delayed pull-down driving signal SETFD and the power-down signal PWRDN, and prevents the ground voltage terminal from being coupled to the inverter unit 210 through the current controller 220.

On the other hand, when entering the power-down mode, the power-down signal PWRDN transitions to a high level. The output signal of the inverter IV7 goes to a low level.

Under this condition, the pull-down driving signal SETFD goes to a low level irrespective of a logic level of the set signal SET, such that it is impossible for the current controller 220 to provide the ground voltage VSS to the inverter unit 210. As a result, a standby current of the inverter unit 210 and a turn-on current of the transistors in the inverter unit 210 can be reduced.

Figure 4:
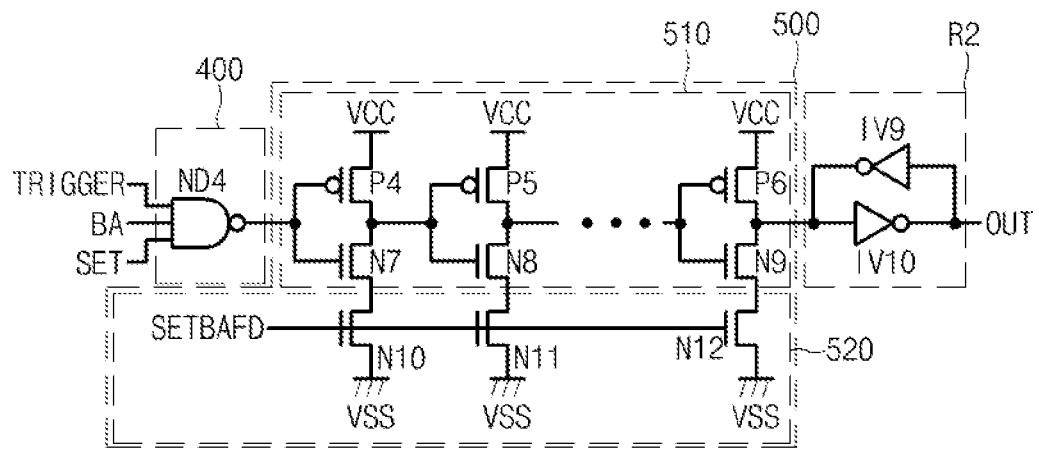
FIG. 4 illustrates a circuit diagram of a current control device according to another embodiment of the present invention.

FIG. 4 illustrates a circuit diagram of a current control device according to another embodiment of the present invention.

Referring to FIG. 4, the current control device includes an input controller 400, a drive unit 500, and a storage unit R2.

The input controller 400 includes a NAND gate ND4. The NAND gate ND4 performs a NAND operation on a trigger signal TRIGGER, a bank active signal BA, and a set signal SET, and outputs the NAND operation result.

The drive unit 500 includes an inverter unit 510 and a current controller 520.

The inverter unit 510 includes pairs of PMOS transistors P4~P6 and NMOS transistors N7~N9. In other words, the inverter unit 510 includes a plurality of inverters serially connected in the form of an inverter chain. In another embodiment, the inverter 510 may be composed of a plurality of delay elements connected in series to each other.

The current controller 520 includes a plurality of pull-down driving elements disposed between the inverter unit 510 and the ground voltage terminal VSS such that the pull-down driving elements are controlled by a pull-down driving signal SETBAFD. The pull-down driving elements are composed of NMOS transistors N10~N12.

The NMOS transistors N10, N11 and N12 of the current controller 520 are coupled to the NMOS transistors N7, N8, and N9 of the inverter unit 510, respectively. The NMOS transistors N10~N12 receive the pull-down driving signal SETBAFD through a common gate terminal.

The PMOS transistor P4, the NMOS transistor N7, and the NMOS transistor N10 are serially coupled between the power-supply voltage terminal VCC and the ground voltage terminal VSS. The PMOS transistor P4 and the NMOS transistor N7 receive an output signal of the NAND gate ND4 through a common gate terminal. The NMOS transistor N10 receives the pull-down driving signal SETBAFD through a gate terminal.

The PMOS transistor P5, the NMOS transistor N8, and the NMOS transistor N11 are serially coupled between the power-supply voltage terminal VCC and the ground voltage terminal VSS. A common gate terminal of the PMOS transistor P5 and the NMOS transistor N8 is coupled to an inverter element of the previous stage, e.g., an output terminal of the inverter composed of the PMOS transistor P4 and the NMOS transistor N7. The NMOS transistor N11 receives the pull-down driving signal SETBAFD through a gate terminal.

The PMOS transistor P6, the NMOS transistor N9, and the NMOS transistor N12 are serially coupled between the power-supply voltage terminal VCC and the ground voltage terminal VSS. A common gate terminal of the PMOS transistor P6 and the NMOS transistor N9 is coupled to an inverter element of a previous stage. The NMOS transistor N12 receives the pull-down driving signal SETBAFD through a gate terminal.

The storage unit R2 includes latch-type inverters IV9 and IV10 in which an input terminal of the inverter IV9 is coupled to an output terminal of the inverter IV10 and an output terminal of the inverter IV9 is coupled to an input terminal of the inverter IV10. The storage unit R2 latches an output signal of the drive unit 500 and outputs an output signal OUT.

Figure 5:
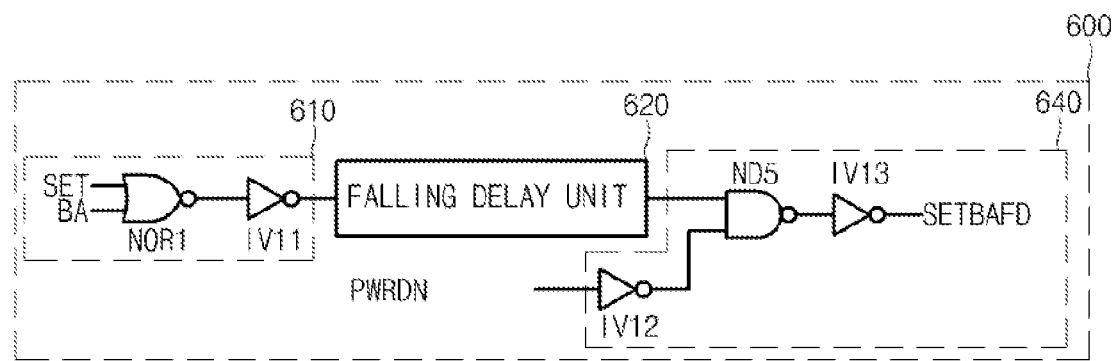
FIG. 5 illustrates a detailed circuit diagram of a drive signal generator according to another embodiment of the present invention.

FIG. 5 illustrates a detailed circuit diagram of a drive signal generator 600 for generating the pull-down driving signal SETBAFD used in the current control device shown in FIG. 4 according to an embodiment of the present invention.

Referring to FIG. 5, the drive signal generator 600 includes an input unit 610, a falling delay unit 620, and an output unit 640.

The input unit 610 includes a NOR gate NOR1 and an inverter IV11. The NOR gate NOR1 performs a NOR operation on the set signal SET and the bank active signal BA. The inverter IV11 inverts an output signal of the NOR gate NOR1. If any one of the set signal SET and the bank active signal BA goes to a high level, the input unit 610 enables an output signal of the inverter IV11 to a high level.

The falling delay unit 620 delays a falling start time of the output signal of the input unit 610. That is, if the set signal SET or the bank active signal BA is enabled to a high level, the falling delay unit 620 extends a period of the high level status by a predetermined time, such that a transition start time for the falling status is delayed by the predetermined time.

The output unit 640 includes inverters IV12 and IV13 and a NAND gate ND5. The NAND gate ND5 performs a NAND operation on an output signal of the falling delay unit 620 and an inverted power down signal output from the inverter IV12 that inverts a power down signal PWRDN. The inverter IV13 inverts an output signal of the NAND gate ND5 to output the pull-down driving signal SETBAFD.

Operations of the current control device shown in FIG. 4 will hereinafter be described in detail with reference to FIGS. 4 and 5.

In a normal operation mode, not the power-down mode, the power-down signal PWRDN is deactivated to a low level. Accordingly, the inverted power down signal output from the inverter IV12 has a high level.

In addition, if any one of the set signal SET and the bank active signal BA transitions from a low level to a high level, the output signal of the NAND gate ND5 goes to a low level, and the pull-down driving signal SETBAFD corresponding to the output signal of the inverter IV13 goes to a high level.

In this case, if the set signal SET and the bank active signal BA go to a high level and the trigger signal TRIGGER goes to a low level, the output signal of the NAND gate ND4 goes to a high level so that the inverter unit 510 operates.

When the pull-down driving signal SETBAFD goes to a high level, all the NMOS transistors N10~N12 of the current controller 520 are turned on. As a result, a ground voltage VSS is supplied to source terminals of the NMOS transistors N7~N9 of the inverter unit 510.

After that, when the trigger signal TRIGGER is activated to a high level, the output signal of the NAND gate ND4 goes to a low level so that the current control device normally operates.

Subsequently, if the trigger signal TRIGGER is deactivated to a low level and the set signal SET and the bank active signal BA transition from a high level to a low level, the falling start time of the set signal SET or the bank active signal BA is delayed by the predetermined time by the falling delay unit 620. In other words, although the set signal SET and the bank active signal BA transition to a low level, the output signal of the falling delay unit 620 maintains a high level during at least the predetermined time.

Therefore, the pull-down driving signal SETBAFD maintains a high level for at least the predetermined time, such that the current controller 520 is continuously turned on. If the current controller 520 maintains the turn-on status, the ground voltage VSS is continuously provided to the inverter unit 510 such that an operation time of the storage unit R2 can be guaranteed.

After lapse of a delay time of the falling delay unit 620, the pull-down driving signal SETIDLEFD transitions from a high level to a low level, such that each NMOS transistor in the current controller 520 is turned off to prevent the ground voltage VSS from being applied to the inverter unit 510. As a result, the inverter unit 510 is deactivated.

The storage unit R2 for latching a previous output level to prevent the output signal of the inverter unit 510 from entering an abnormal status during the ground voltage VSS is not applied to the inverter unit 510.

On the other hand, when entering the power-down mode, the power-down signal PWRDN transitions to a high level. The output signal of the inverter IV12 goes to a low level.

Under this condition, the pull-down driving signal SETBAFD goes to a low level irrespective of a logic level of the set signal SET or the bank active signal BA, such that it is impossible for the current controller 520 to provide the ground voltage VSS to the inverter unit 510. As a result, a standby current of the inverter unit 510 and a turn-on current of the transistors in the inverter unit 510 can be reduced.

As is apparent from the above description, the embodiments of the present invention have the following characteristics.

First, the current control device according to the embodiments of the present invention controls the path of the ground voltage VSS for use in the semiconductor memory device, such that it can reduce not only the standby current generated in the circuit but also the turn-on current of the transistor according to whether the circuit enters the idle status or the power down mode.

Second, the current control device according to the embodiments of the present invention reduces not only the standby current but also the turn-on current of the transistor, so that it can implement a low-power semiconductor memory device such as a low-power DRAM device.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A current control circuit, comprising:
an input controller configured to combine a trigger signal and a set signal, wherein the set signal controls an internal operation of a semiconductor device ; and
a drive unit configured to drive an output signal of the input controller in response to a pull-down driving signal,
wherein the drive unit includes:
an inverter unit configured to drive the output signal of the input controller; and
a current controller configured to selectively provide a ground voltage to the inverter unit in response to the pull-down driving signal.

2. The current control circuit according to claim 1, wherein the inverter unit comprises a plurality of inverter elements serially connected in the form of an inverter chain, the semiconductor device being a memory device.

3. The current control circuit according to claim 1, wherein the current controller comprises a plurality of pull-down driving elements coupled between the inverter unit and a ground voltage terminal, the pull-down driving elements being selectively activated in response to the pull-down driving signal.

4. The current control circuit according to claim 1, further comprising a drive signal generator configured to generate the pull-down driving signal.

5. The current control circuit according to claim 4, wherein the drive signal generator comprises:
a falling delay unit configured to delay a falling start time of the set signal by a predetermined time; and
an output unit configured to combine an output signal of the falling delay unit and a power-down signal so as to generate the pull-down driving signal.

6. The current control circuit according to claim 5, wherein the drive signal generator deactivates the pull-down driving signal irrespective of activation of the output signal of the falling delay unit when the power-down signal is activated.

7. The current control circuit according to claim 1, further comprising a storage unit configured to latch an output signal of the drive unit for a predetermined time.

8. The current control circuit according to claim 1, wherein the current controller operates in response to the pull-down driving signal and prevents the ground voltage from being supplied to the inverter unit in a power-down mode.

9. A current control circuit, comprising:
an input controller configured to combine a trigger signal, a bank active signal, and a set signal, wherein the set signal controls an internal operation of a semiconductor device; and
a drive unit configured to drive an output signal of the input controller in response to a pull-down driving signal,
wherein the drive unit includes:
an inverter unit configured to drive the output signal of the input controller; and
a current controller configured to selectively provide a ground voltage to the inverter unit in response to the pull-down driving signal.

10. The current control circuit according to claim 9, wherein the inverter unit comprises a plurality of inverter elements serially connected in the form of an inverter chain, and
wherein the semiconductor device is a memory device.

11. The current control circuit according to claim 9, wherein the current controller comprises a plurality of pull-down driving elements coupled between the inverter unit and a ground voltage terminal, the pull-down driving elements being selectively activated in response to the pull-down driving signal.

12. The current control circuit according to claim 9, further comprising a drive signal generator configured to generate the pull-down driving signal.

13. The current control circuit according to claim 12, wherein the drive signal generator includes:
an input unit configured to combine the set signal and the bank active signal;
a falling delay unit configured to delay a falling start time of an output signal of the input unit by a predetermined time; and
an output unit configured to combine an output signal of the falling delay unit and a power-down signal so as to generate the pull-down driving signal.

14. The current control circuit according to claim 12, wherein the drive signal generator deactivates the pull-down driving signal irrespective of activation of the output signal of the falling delay unit when the power-down signal is activated.

15. The current control circuit according to claim 9, further comprising a storage unit configured to latch an output signal of the drive unit for a predetermined time.

16. The current control circuit according to claim 9, wherein the current controller operates in response to the pull-down driving signal to thereby prevent the ground voltage from being supplied to the inverting unit in a power-down mode.

17. The current control circuit according to claim 9, wherein the inverter unit comprises a plurality of inverter elements serially connected in the form of an inverter chain.

18. The current control circuit according to claim 9, wherein the current controller comprises a plurality of pull-down driving elements coupled between the inverter unit and a ground voltage terminal.

19. The current control circuit according to claim 18, wherein each inverter element is connected to a single corresponding pull-down driving element.

* * * * *